United States Patent
Kim et al.

[11] Patent Number: 6,150,868
[45] Date of Patent: Nov. 21, 2000

[54] ANTI-FUSE PROGRAMMING CIRCUIT

[75] Inventors: Young-Hee Kim, Pahang-Shi; Kie-Bong Ku, Yicheon-Shi, both of Rep. of Korea

[73] Assignee: Hyundai Electronics Industries, Yicheon-shi, Rep. of Korea

[21] Appl. No.: 09/342,600

[22] Filed: Jun. 29, 1999

[30] Foreign Application Priority Data

Jun. 30, 1998 [KR] Rep. of Korea ............... 98-26226

[51] Int. Cl.$^7$ ............................................. H01H 37/76
[52] U.S. Cl. ..................... 327/525; 365/96; 365/225.7
[58] Field of Search ..................... 327/525, 526; 365/96, 225.7

[56] References Cited

U.S. PATENT DOCUMENTS

| | | | |
|---|---|---|---|
| 5,448,187 | 9/1995 | Kowalski | 327/525 |
| 5,689,455 | 11/1997 | Mullarkey et al. | 365/96 |
| 5,945,840 | 8/1999 | Cowles et al. | 327/525 |

*Primary Examiner*—Jung Ho Kim
*Attorney, Agent, or Firm*—Oliff & Berridge, PLC

[57] ABSTRACT

An anti-fuse programming circuit comprising an operation switching part for precharging the anti-fuse programming circuit with a half voltage to operate it, an anti-fuse connected to the operation switching part, the anti-fuse being subjected to a dielectric breakdown when it is supplied with an overcurrent, a sense signal input part for inputting a sense signal to verify a programmed state of the anti-fuse, a breakdown voltage supply part for supplying a source voltage for the dielectric breakdown of the anti-fuse, an output part for outputting a signal indicative of the programmed state of the anti-fuse in response to the sense signal inputted by the sense signal input part, a current blocking part for blocking a current path from the breakdown voltage supply part to the anti-fuse in response to a control signal from the output part, and a latch part for strongly stabilizing the anti-fuse at the level of the half voltage in response to the control signal from the output part. According to the present invention, the programmed state of the anti-fuse can be verified and current consumption can significantly be reduced in programming the anti-fuse.

7 Claims, 2 Drawing Sheets

ANTI-FUSE PROGRAMMING CIRCUIT

BACKGROUND OF THE INVENTION

1. Field of the Invention

The present invention relates in general to anti-fuse programming circuits, and more particularly to an anti-fuse programming circuit which is capable of making an anti-fuse conductive in a dielectric breakdown manner to program it and verifying the programmed state of the anti-fuse.

2. Description of the Prior Art

A general fuse, when the amount of current exceeding a predetermined value flows therethrough, melts and blows due to a generated heat to form an open circuit for protection of the associated device.

On the other hand, a fuse is used in a redundancy circuit for a semiconductor memory device to replace a failed line with a spare line. In order to program the fuse used, there have been proposed various methods such as, for example, an electrical fuse method of applying an overcurrent to the fuse to melt and cut it and a laser cutting method of applying a laser beam to the fuse to burn and cut it.

Among the above methods, the laser cutting method is widely used because it is simple, reliable and easy to arrange. In this case, the fuse is made of a polysilicon wire or metal wire.

The overcurrent cutting methods requires a high current driver and fuse blowing pad, resulting in an increase in occupying area. Further, a residue may be present after the cutting, thus causing a switch-off phenomenon.

In the case of cutting polysilicon using a laser beam, an error may occur in accurately applying the laser beam to the polysilicon and a residue may be present after the cutting. In this case, the laser cutting method requires a large amount of processing time, and it is difficult and inaccurate to perform. Further, the repair is impossible at a package level, resulting in a degradation in reliability.

In order to solve the above problems, there has recently been proposed a new element, or a so-called anti-fuse, which can be programmed simply even at the package level.

The anti-fuse is programmed to interconnect an upper electrode and lower electrode. Namely, the anti-fuse includes an insulating film formed between the upper and lower electrodes in such a manner that it can easily be broken down according to a dielectric breakdown voltage which is a voltage difference between the upper and lower electrodes.

In this regard, the anti-fuse is programmed to interconnect two electrodes, whereas a general fuse is programmed to disconnect them from each other.

As a result, there is a need for a circuit which is capable of programming the anti-fuse and verifying the programmed result of the anti-fuse.

SUMMARY OF THE INVENTION

Therefore, the present invention has been made in view of the above problems, and it is an object of the present invention to provide an anti-fuse programming circuit for programming an anti-fuse with low-power at a package step in response to an anti-fuse programming signal and verifying the programmed state of the anti-fuse.

In accordance with the present invention, the above and other objects can be accomplished by a provision of an anti-fuse programming circuit comprising operation switching means for precharging the anti-fuse programming circuit with a half voltage to operate it; an anti-fuse connected to the operation switching means, the anti-fuse being subjected to a dielectric breakdown when it is supplied with an overcurrent; sense signal input means for inputting a sense signal to verify a programmed state of the anti-fuse; breakdown voltage supply means for supplying a source voltage for the dielectric breakdown of the anti-fuse; output means for outputting a signal indicative of the programmed state of the anti-fuse in response to the sense signal inputted by the sense signal input means; current blocking means for blocking a current path from the breakdown voltage supply means to the anti-fuse in response to a control signal from the output means; and latch means for strongly stabilizing the anti-fuse at the level of the half voltage in response to the control signal from the output means.

The anti-fuse remains insulated at the half voltage level and it is subjected to the dielectric breakdown at the source voltage level.

At a normal state where no programming signal is inputted, the operation switching means supplies the half voltage to the anti-fuse programming circuit to precharge it with the half voltage. The half voltage is strongly stabilized by the latch means even when the precharge voltage is instable.

If the programming signal is inputted to program the anti-fuse under the above precharged condition, the breakdown voltage supply means supplies the source voltage to the anti-fuse for the dielectric breakdown thereof.

If the sense signal is inputted by the sense signal input means to verify the programmed state of the anti-fuse under the condition that the anti-fuse is programmed in the above manner, the output means outputs the signal indicative of the dielectric breakdown state of the anti-fuse.

The dielectric breakdown of the anti-fuse may result in the forming of a current path from the breakdown voltage supply means to the anti-fuse. At this time, the current blocking means functions to block such a current path in response to the control signal from the output means to prevent further current consumption.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
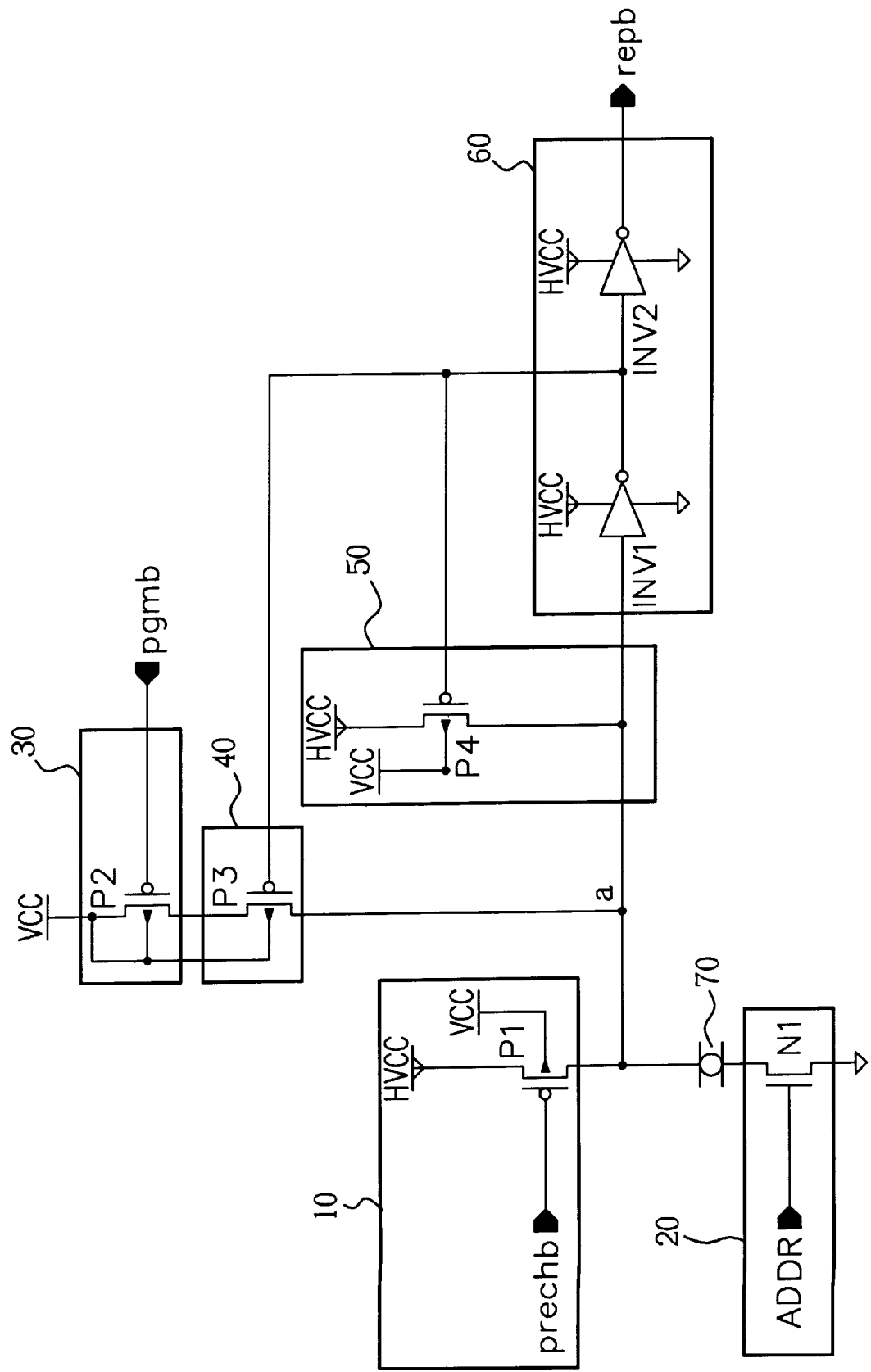
FIG. 1 is a circuit diagram showing the construction of an anti-fuse programming circuit in accordance with an embodiment of the present invention.

FIG. 1 is a circuit diagram showing the construction of an anti-fuse programming circuit which is applied to a memory device in accordance with an embodiment of the present invention.

With reference to FIG. 1, an operation switching part 10 is adapted to precharge the anti-fuse programming circuit with a half voltage HVCC to operate it. To this end, the operation switching part 10 is provided with a first PMOS transistor P1.

The first PMOS transistor P1 has its source connected to the half voltage HVCC, its drain connected to one side of an anti-fuse 70 and its gate for inputting a complementary precharge signal prechb.

A common connection point of the one side of the anti-fuse 70 and the drain of the first PMOS transistor P1 will be referred to hereinafter as a node 'a'.

A sense signal input part 20 includes an NMOS transistor N1 having its drain connected to the other side of the anti-fuse 70, its source connected to a ground voltage terminal and its gate for inputting a failed address signal ADDR.

An output part 60 includes a first inverter INV1 for inverting a voltage level at the node a, and a second inverter INV2 for inverting an output signal from the first inverter INV1.

The output repb of the second inverter INV2, or the output of the output part 60, is used to verify the programmed state of the anti-fuse 70. At a normal state, the output repb of the second inverter INV2 remains high in level.

The first and second inverters INV1 and INV2 are operated by the half voltage HVCC, and the output repb of the output part 60 thus has the level of the half voltage HVCC when it is high in level.

A breakdown voltage supply part 30 is operated in response to a complementary programming signal pgmb to supply a source voltage VCC to the node a. To this end, the breakdown voltage supply part 30 is provided with a second PMOS transistor P2.

A current blocking part 40 is adapted to interrupt a breakdown voltage for the anti-fuse 70, or the source voltage VCC supplied from the breakdown voltage supply part 30 to block a current path from the breakdown voltage supply part 30 to the anti-fuse 70 after the anti-fuse 70 is programmed. To this end, the current blocking part 40 is provided with a third PMOS transistor P3.

The second PMOS transistor P2 in the breakdown voltage supply part 30 has its source connected to the source voltage VCC, its drain connected to a source of the third PMOS transistor P3 in the current blocking part 40 and its gate for inputting the complementary programming signal pgmb. The third PMOS transistor P3 has its drain connected to the node a and its gate for inputting the output signal from the first inverter INV1 in the output part 60 fed back thereto, which inverts the voltage level at the node a.

A latch part 50 is adapted to strongly stabilize the voltage level at the node a to prevent the output repb of the output part 60 from varying in level due to an instability of the half voltage HVCC applied to the node a at the normal state. To this end, the latch part 50 is provided with a fourth PMOS transistor P4 operated in response to the output signal from the first inverter INV1 in the output part 60 fed back thereto, which inverts the voltage level at the node a.

If the anti-fuse 70 is programmed under the condition that the failed address signal ADDR is inputted by the sense signal input part 50, the node a goes low in level, thereby causing the output of the first inverter INV1 to become high in level. As a result, the fourth PMOS transistor P4 in the latch part 50 is turned off to supply no further half voltage HVCC to the node a.

Figure 2:
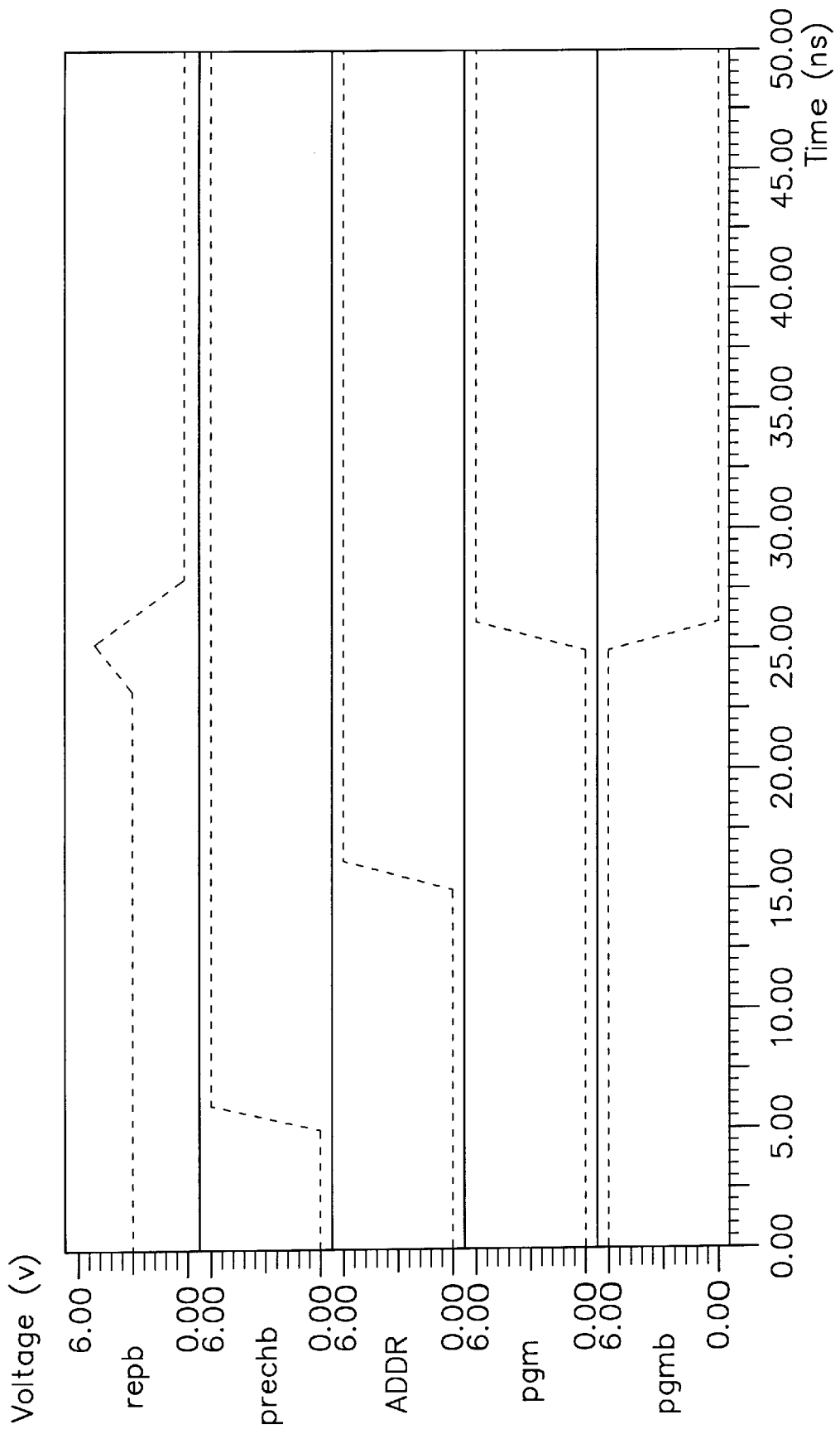
FIG. 2 is a graph showing the simulated results of input/output signals in the anti-fuse programming circuit in FIG. 1.

FIG. 2 is a graph showing the simulated results of the input/output signals in the anti-fuse programming circuit in FIG. 1.

The operation of the anti-fuse programming circuit with the above-mentioned construction in accordance with the present invention will hereinafter be described in detail with reference to FIG. 2.

First, at the normal state, a programming signal pgm is low in level and the complementary programming signal pgmb is high in level.

At this time, if the complementary precharge signal prechb goes low in level to precharge the anti-fuse programming circuit, the fist PMOS transistor P1 in the operation switching part 10 is turned on to supply the half voltage HVCC to the node a. As a result, the anti-fuse programming circuit is precharged with the half voltage HVCC.

Then, in the output part 60, the half voltage HVCC at the node a is inverted from high to low in level by the first inverter INV1 and again inverted from low to high in level by the second inverter INV2. As a result, the output repb of the output part 60 has a high voltage level which is the level of the half voltage HVCC.

At this time, the low level output of the first inverter INV1 turns on the fourth PMOS transistor P4 in the latch part 50, thereby causing the fourth PMOS transistor P4 to supply the half voltage HVCC to the node a. As a result, the voltage level at the node a is strongly stabilized to prevent the output of the output part 60 from varying in level due to an instability of that voltage level.

The low level output of the first inverter INV1 also turns on the third PMOS transistor P3 in the current blocking part 40, thereby allowing current from the breakdown voltage supply part 30 to flow through the third PMOS transistor P3 upon application of the program signal pgm.

If the complementary precharge signal prechb goes high in level under the above precharged condition, the first PMOS transistor P1 is turned off and the half voltage HVCC is thus not applied to the node a. At this time, the node a, however, remains precharged strongly with the half voltage HVCC by the latch part 50.

The third PMOS transistor P3 in the current blocking part 40 remains on in response to the low level output of the first inverter INV1 fed back thereto.

At this time, if the failed address signal ADDR goes high in level to sense the programmed state of the anti-fuse 70, the NMOS transistor N1 is turned on. However, because there is no dielectric breakdown in the anti-fuse 70, the node a is not changed in voltage level, resulting in no variation in the output repb of the output part 60.

Thereafter, when the programming signal pgm goes high in level to program the anti-fuse 70, the complementary programming signal pgmb becomes low in level. At this time, the second PMOS transistor P2 in the breakdown voltage supply part 30 is turned on to supply the source voltage VCC to the node a. As a result, a current path is formed from the node a to the ground voltage terminal through the anti-fuse 70 and the turned-on NMOS transistor N1, thus causing a dielectric breakdown in the anti-fuse 70.

If the dielectric breakdown occurs in the anti-fuse 70 in the above manner, the node a is changed from high to low in level and then inverted from low to high in level by the first inverter INV1. As a result, the third PMOS transistor P3 in the current blocking part 40 is turned off to block the continuous supply of the source voltage VCC from the breakdown voltage supply part 30. The high level output of the first inverter INV1 also turns off the fourth PMOS transistor P4 in the latch part 50 so that the half voltage HVCC cannot further be supplied to the node a. Further, the turned-off fourth PMOS transistor P4 functions to prevent the voltage level at the node a from being transferred to a half voltage HVCC terminal when it is the level of the source voltage VCC.

Then, the low level voltage at the node a is sequentially inverted by the first and second inverters INV1 and INV2, resulting in the output repb of the output part 60 becoming low in level. This indicates that the programmed state of the anti-fuse 70 is normal.

As apparent from the above description, according to the present invention, the anti-fuse can be programmed in a dielectric breakdown manner at a package step of a semiconductor device to interconnect two electrodes. This results in improvements in unit cost and reliability.

Further, after the anti-fuse is programmed in response to the anti-fuse programming signal, the programmed state thereof can be verified. Moreover, after a dielectric breakdown occurs in the anti-fuse, the continuous power supply thereto is blocked, resulting in a significant reduction in current consumption.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An anti-fuse programming circuit comprising:

operation switching means for precharging said anti-fuse programming circuit with a half voltage to operate it;

an anti-fuse connected to said operation switching means, said anti-fuse being subjected to a dielectric breakdown when it is supplied with an overcurrent;

sense signal input means for inputting a sense signal to verify a programmed state of said anti-fuse;

breakdown voltage supply means for supplying a source voltage for the dielectric breakdown of said anti-fuse;

output means for outputting a signal indicative of the programmed state of said anti-fuse in response to said sense signal inputted by said sense signal input means;

current blocking means for blocking a current path from said breakdown voltage supply means to said anti-fuse in response to a control signal from said output means; and latch means for strongly stabilizing said anti-fuse at the level of said half voltage in response to said control signal from said output means.

2. An anti-fuse programming circuit as set forth in claim 1, wherein said operation switching means includes a PMOS transistor connected between a half voltage terminal and said anti-fuse, said PMOS transistor being operated in response to a precharge signal.

3. An anti-fuse programming circuit as set forth in claim 1, wherein said sense signal input means includes an NMOS transistor connected between said anti-fuse and a ground voltage terminal, said NMOS transistor being operated in response to said sense signal.

4. An anti-fuse programming circuit as set forth in claim 1, wherein said current blocking means includes a PMOS transistor connected between an output terminal of said breakdown voltage supply means and said anti-fuse, said PMOS transistor being operated in response to said control signal from said output means.

5. An anti-fuse programming circuit as set forth in claim 1, wherein said breakdown voltage supply means includes a PMOS transistor connected between a source voltage terminal and said current blocking means, said PMOS transistor being operated in response to a programming signal.

6. An anti-fuse programming circuit as set forth in claim 1, wherein said output means includes:

a first inverter connected to said anti-fuse, said first inverter supplied with said half voltage to invert an output signal from said anti-fuse and output the inverted signal as said control signal; and a second inverter supplied with said half voltage to invert said control signal from said first inverter and output the inverted signal as said signal indicative of the programmed state of said anti-fuse.

7. An anti-fuse programming circuit as set forth in claim 1, wherein said latch means includes a PMOS transistor connected between said anti-fuse and a half voltage terminal, said PMOS transistor being operated in response to said control signal from said output means.

* * * * *